(12) United States Patent
Tatsumi

(10) Patent No.: US 6,925,018 B2
(45) Date of Patent: Aug. 2, 2005

(54) SYSTEM-IN-PACKAGE TYPE SEMICONDUCTOR DEVICE

(75) Inventor: Takashi Tatsumi, Tokyo (JP)

(73) Assignee: Renesas Technology Corp., Chiyoda-ku (JP)

( * ) Notice: Subject to any disclaimer, the term of this patent is extended or adjusted under 35 U.S.C. 154(b) by 32 days.

(21) Appl. No.: 10/411,271

(22) Filed: Apr. 11, 2003

(65) Prior Publication Data

US 2004/0085796 A1 May 6, 2004

(30) Foreign Application Priority Data

Nov. 6, 2002 (JP) ........................................ 2002-322321

(51) Int. Cl.[7] ................................................ G11C 7/00
(52) U.S. Cl. ........................................ 365/201; 365/63
(58) Field of Search ..................... 365/201, 63, 230.03; 714/5, 18

(56) References Cited

U.S. PATENT DOCUMENTS

| | | | | |
|---|---|---|---|---|
| 6,732,304 B1 | * | 5/2004 | Ong ........................... | 714/718 |
| 2003/0037277 A1 | * | 2/2003 | Tamura ....................... | 714/5 |
| 2003/0065997 A1 | * | 4/2003 | Yamazaki et al. ........... | 714/718 |

FOREIGN PATENT DOCUMENTS

| | | |
|---|---|---|
| JP | 58-166275 | 10/1983 |
| JP | 61-54550 | 3/1986 |
| JP | 4-85848 | 3/1992 |
| JP | 10-283777 | 10/1998 |
| JP | 11-211794 | 8/1999 |
| JP | 11-250700 | 9/1999 |
| JP | 2000-332192 | 11/2000 |
| JP | 2001-35200 | 2/2001 |

* cited by examiner

Primary Examiner—Vu A. Le
(74) Attorney, Agent, or Firm—Burns, Doane, Swecker & Mathis, L.L.P.

(57) ABSTRACT

A system-in-package (SiP) type semiconductor device has a test function capable of conducting a test singly on a memory chip directly from outside. When a mode signal included in a test signal input from an external connection terminal indicates a "normal operation mode", a test circuit provided on a logic chip allows a logic circuit to use an access path (wiring) to a memory circuit. On the other hand, when the mode signal indicates a "test mode", the test circuit uses the access path to access the memory circuit and conducts a test, an accelerated life test, or a multi-bit test, based on the content of the test signal input from the external connection terminal. The test circuit also conducts a built-in self-test.

8 Claims, 14 Drawing Sheets

SYSTEM-IN-PACKAGE TYPE SEMICONDUCTOR DEVICE

BACKGROUND OF THE INVENTION

1) Field of the Invention

The present invention relates to a technology for connecting a plurality of semiconductor chips to each other and sealing the chips in one package.

2) Description of the Related Art

In a System-in-Package type semiconductor device (hereinafter referred to as SiP type semiconductor device), a logic chip and at least one memory chip (for example, DRAM chip, SRAM chip, or flash memory chip) are connected to each other, as a plurality of semiconductor chips, and sealed in one package. The logic chip is connected to an external connection terminal, and the memory chip is connected to the external connection terminal via the logic chip. One of examples of the configuration is disclosed in Japanese Patent Application Laid-Open No. 10-283777.

In order to conduct a test on semiconductor devices in a packaged state or screening initial defects of the devices, it is necessary to conduct an accelerated life test when products are shipped. However, in the SiP type semiconductor device, input/output of the memory chip to/from outside cannot be directly performed, and must be performed via the logic chip at any time. Hence, there is a problem in that a test on the logic chip can be singly conducted, but a test on the memory chip cannot be singly conducted.

SUMMARY OF THE INVENTION

It is an object of the present invention to provide a system-in-package (SiP) type semiconductor device having a test function, by which a test can be conducted singly on a memory chip directly from outside.

The SiP type semiconductor device according to this invention, includes a memory chip for mounting a memory circuit thereon, and a logic chip for mounting a logic circuit thereon, the logic circuit being electrically connected to the memory circuit. The logic circuit and an external connection terminal of the package are connected to each other to be sealed. This semiconductor device also includes a test circuit provided on either the logic chip or the memory chip and for conducting various types of tests by allowing the logic circuit to use an access path to the memory circuit when a mode signal input from a mode terminal provided in the external connection terminal indicates a normal operation mode, or by prohibiting the logic circuit from using the access path but accessing the memory circuit by itself when the mode signal indicates a test mode or when any particular case comes up. Therefore, it is possible to conduct any test, an accelerated life test, or a multi-bit test singly on the memory chip from outside.

These and other objects, features and advantages of the present invention are specifically set forth in or will become apparent from the following detailed descriptions of the invention when read in conjunction with the accompanying drawings.

DETAILED DESCRIPTION

Embodiments of the SiP type semiconductor device according to the present invention are explained in detail below with reference to the accompanying drawings.

Figure 1:
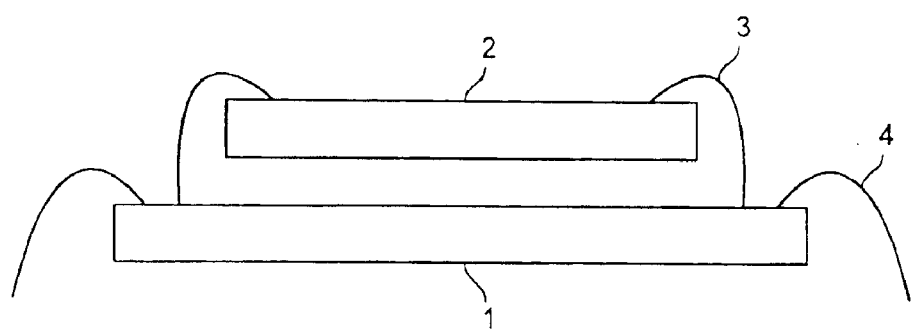
FIG. 1 shows a conceptual diagram of one example of an SiP type semiconductor device, to which the present invention is applied.

A first embodiment of this invention will be explained below. FIG. 1 shows a conceptual diagram of one example of an SiP type semiconductor device to which the present invention is applied. The SiP type semiconductor device is sealed in one package in such a manner that, for example, as shown in FIG. 1, a memory chip 2 on which a memory circuit such as a DRAM is mounted is superposed on a logic chip 1, on which a logic circuit such as a microprocessor is mounted, in a chip on chip structure. The input-output ends of the memory chip 2 are connected to the logic chip 1 by wiring 3, and further connected to external connection terminals by wiring 4, as a part of the input-output ends of the logic chip 1. The SiP type semiconductor device includes, for example, an arrangement in which the logic chip 1 and the memory chip 2 are arranged side by side on a plane, but a connection mode thereof is the same.

In this invention, such a SiP type semiconductor device is shown as a configuration example, in which a test function for enabling independent conduction of a direct test on the memory chip from outside is incorporated in various modes. In each of the embodiments shown below, however, it is assumed that the logic chip and the memory chip are arranged side by side on a plane, for convenience in explanation.

Figure 2:
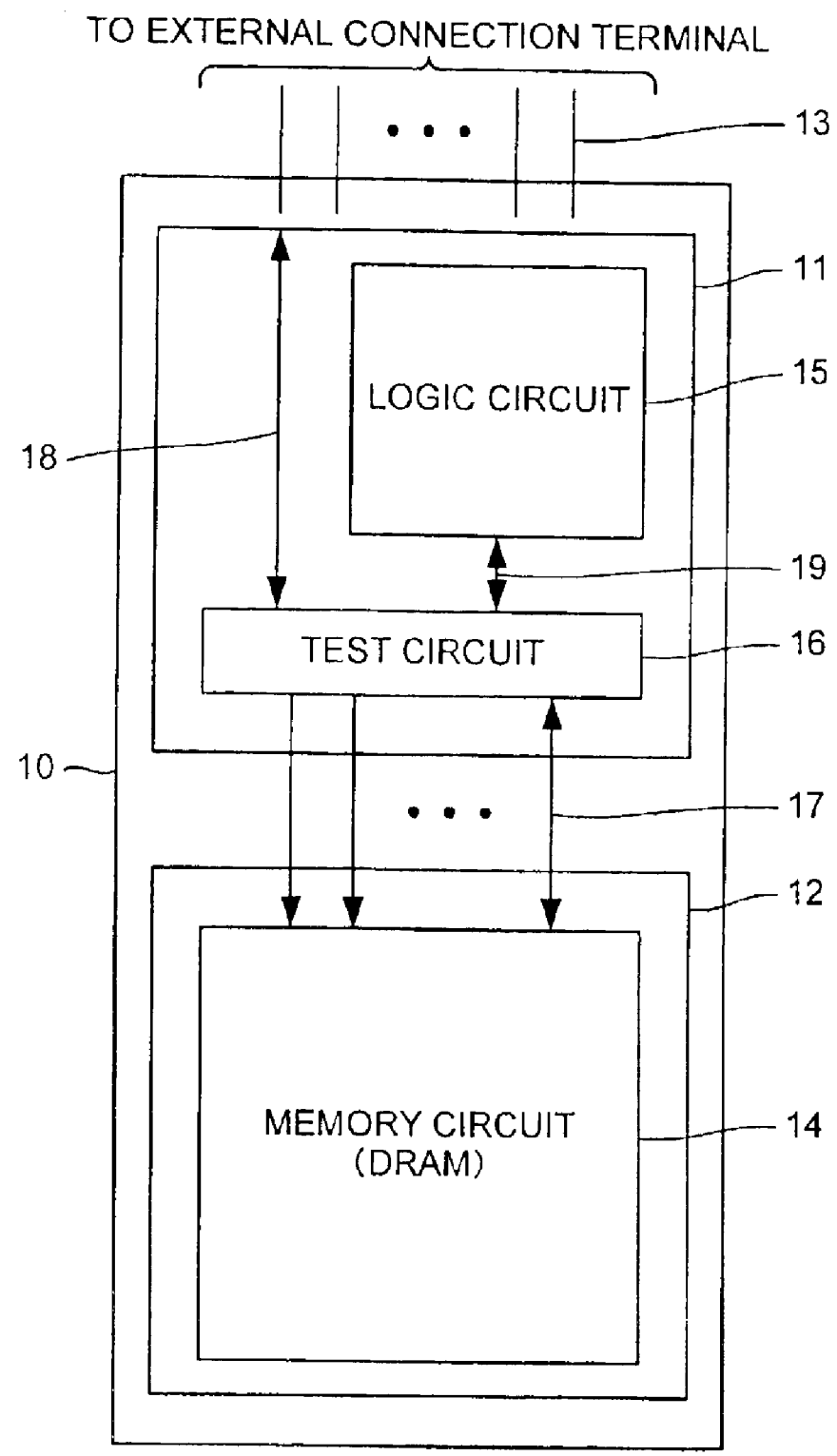
FIG. 2 shows a conceptual diagram of the SiP type semiconductor device, being a first embodiment of the present invention.
Figure 3:
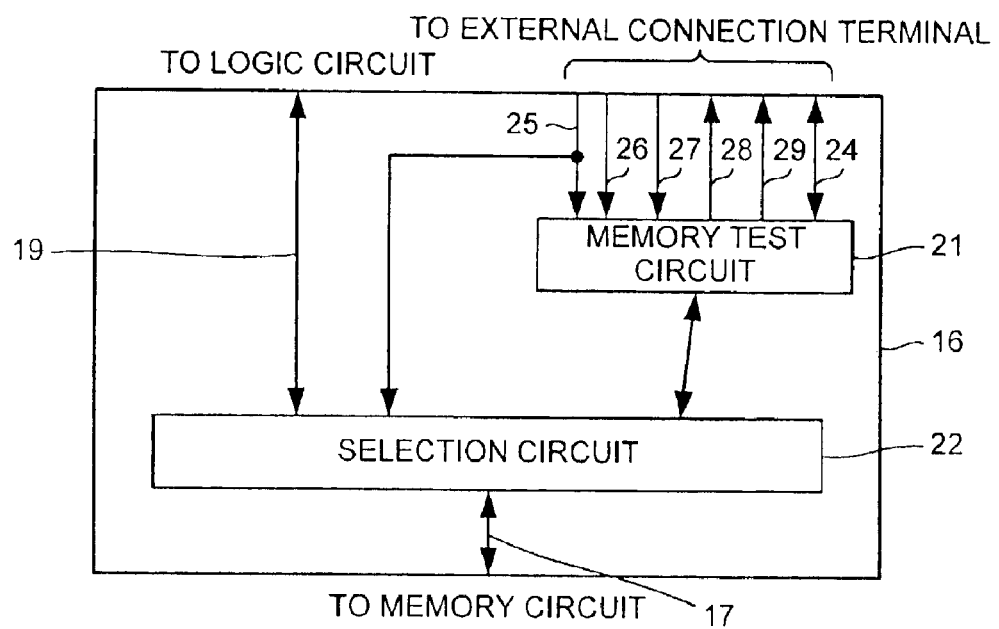
FIG. 3 shows a block diagram of a detailed configuration of a test circuit shown in FIG. 2.

FIG. 2 shows a conceptual diagram of the SiP type semiconductor device, being a first embodiment of the present invention. FIG. 3 shows a block diagram of a detailed configuration of a test circuit shown in FIG. 2. The SiP type semiconductor device 10 shown in FIG. 2 comprises a logic chip 11 and a memory chip 12. The logic chip 11 is connected to an external connection terminal via wiring 13, and is connected to the memory chip 12 via wiring 17.

For example, a dynamic random access memory (DRAM) is mounted on the memory chip 12, as a memory circuit 14. On the other hand, a test circuit 16 is mounted on the logic chip 11, other than a logic circuit 15, the test circuit 16 intervening between the logic circuit 15 and the memory circuit 14.

In other words, the test circuit 16 is electrically connected to the logic circuit 15 on the logic chip 11, and is also connected to the external connection terminal together with the logic circuit 15, via the wiring 13. The test circuit 16 is also connected to the memory circuit 14 on the memory chip 12 via the wiring 17. Therefore, the external connection terminal is formed of a terminal for a signal in normal operation provided to the logic circuit 15 and a terminal for a test signal 18 in a test mode provided to the test circuit 16.

The test circuit 16 uses the wiring 17 as a common access path to the memory circuit 14, and during the normal operation, the test circuit 16 outputs an output signal 19 or the like of the logic circuit 15 onto the wiring 17, and during the testing, outputs a test control signal onto the wiring 17 according to the test signal 18.

The test circuit 16 comprises, as shown in FIG. 3, a memory test circuit 21 and a selection circuit 22. As the test signal 18, a mode signal 25, a read/write address signal 26, a test write data signal 27, a read test data signal 28, a decision result signal 29, and an access control signal 24 are exemplified.

When the mode signal 25 input from the external connection terminal is in the "test mode", the selection circuit 22 directly connects the memory test circuit 21 with the memory circuit 14 via the wiring 17, to allow an access of the memory test circuit 21 to the memory circuit 14. When the mode signal 15 is in the "normal operation mode", the selection circuit 22 directly connects the logic circuit 15 with the memory circuit 14 via the wiring 17, to allow an access of the logic circuit 15 to the memory circuit 14.

When the mode signal 25 input from the external connection terminal is in the "test mode", the memory test circuit 24 conducts the accelerated life test by accessing the memory circuit 14 through the selection circuit 22 using the wiring 17 and performing read/write operation similar to that of a cell checker by raising the internal voltage in the memory circuit 14 to give a stress to the memory circuit 14. This test is conducted based on the read/write address signal 26, the test write data signal 27, and the access control signal, respectively input from the external connection terminal. The memory test circuit 21 outputs the test data signal 28 read at the time of the test, to the external connection terminal.

When the mode signal 25 input from the external connection terminal is in the "multi-bit test mode", the memory test circuit 21 prohibits the logic circuit 15 from using the access path to the memory circuit 14, expands the test data and writes it in the memory circuit 14, degenerates the read data, to thereby perform quality decision, and outputs the decision result signal 29 together with the read test data signal 28 to the external connection terminal.

Further, the memory test circuit 21 has a built-in self-test (BIST) function, such that at the time of power on and at any time thereafter, the memory test circuit 21 prohibits the logic circuit 15 from using the access path to the memory circuit 14, generates various test patterns, writes the generated patterns in the memory circuit 14 via the selection circuit 22, and compares the write data with the read data, to thereby detect a defective bit.

When the built-in self-test (BIST) function is equipped, a second memory chip is provided in the SiP type semiconductor device 10, so that the address information for the defective bits detected at the time of BIST is stored in a second memory circuit mounted on the second memory chip. Thereby, the access can be made to a spare part while avoiding the defective bits. As a result, the operation similar to the operation of cutting the fuse of the defective address can be realized, thereby enabling a relief of the defective bits. The address information for the defective bits may be stored in the memory circuit 14, without providing the second memory chip.

By providing the second memory chip, the production process does not become complicated, and the chip area of the second memory chip does not increase by sharing the logic circuit 15 between the memory circuit 14 and the second memory circuit, that is, the yield is not deteriorated. As a result, the second memory chip can be built in at a low cost. As the second memory circuit, a flash memory, a DRAM, a static random access memory (SRAM) can be used.

Figure 4:
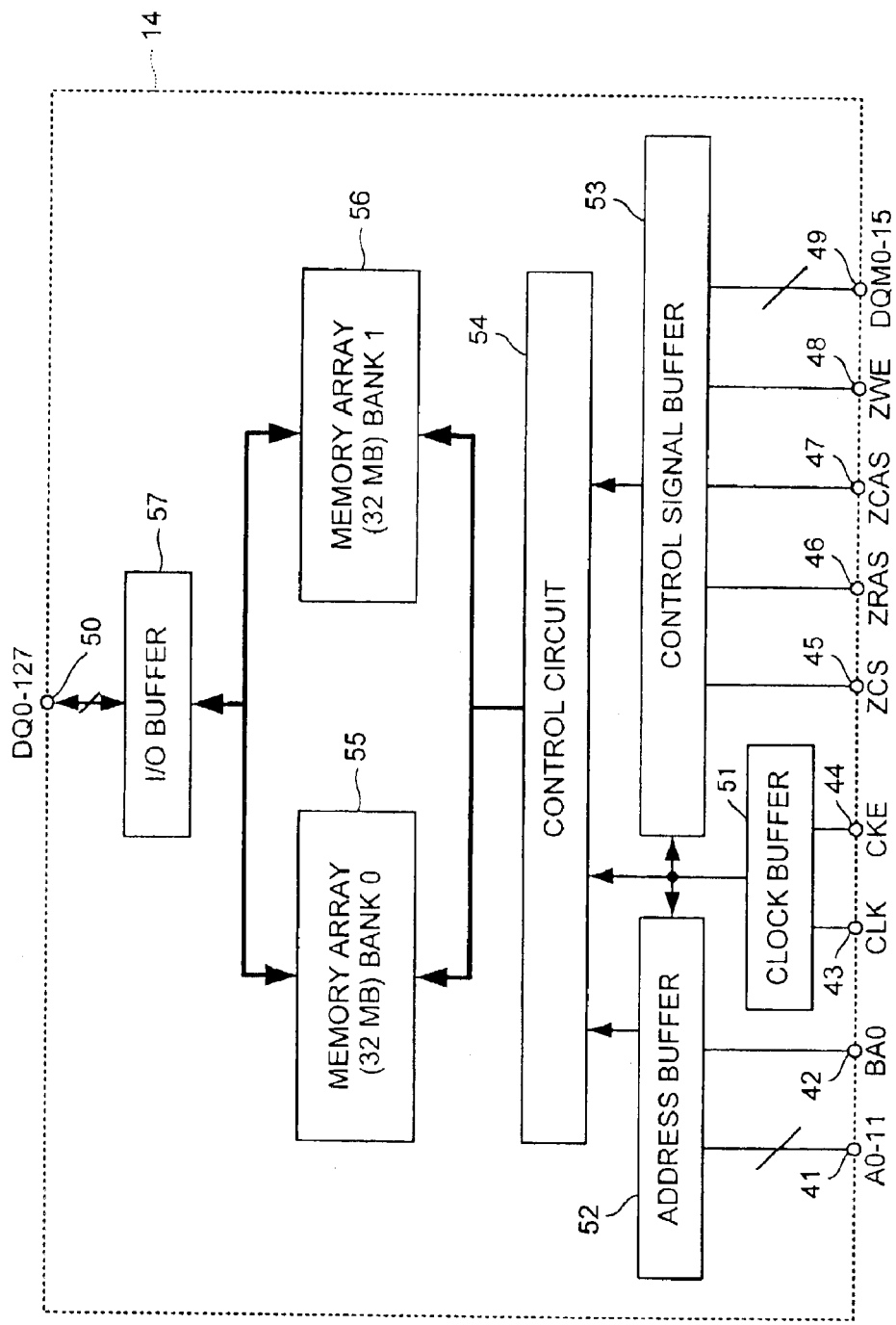
FIG. 4 shows a block diagram of a configuration example of a DRAM constituting a memory circuit shown in FIG. 2.
Figure 5:
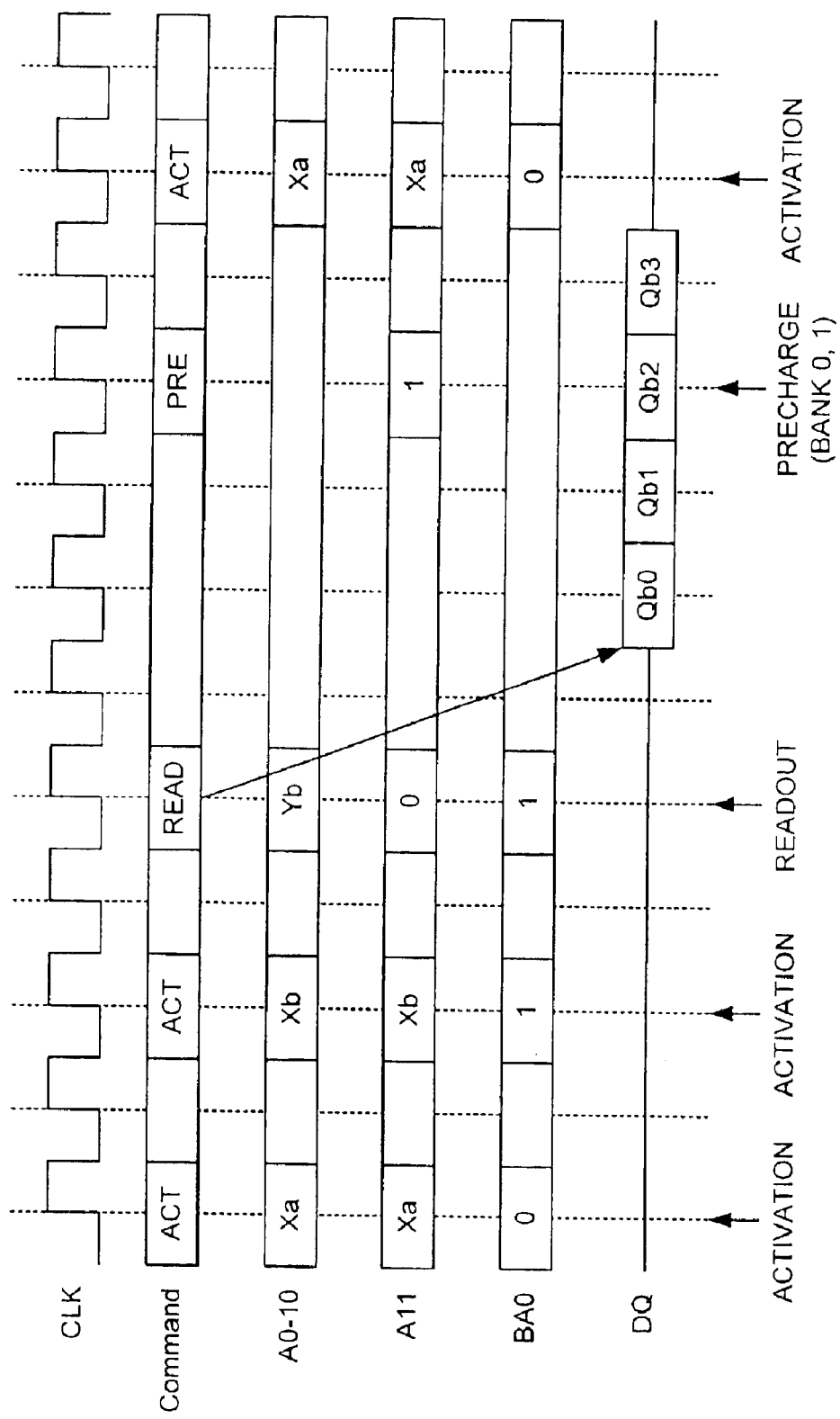
FIG. 5 shows a time chart of the read operation to the DRAM shown in FIG. 4.
Figure 6:
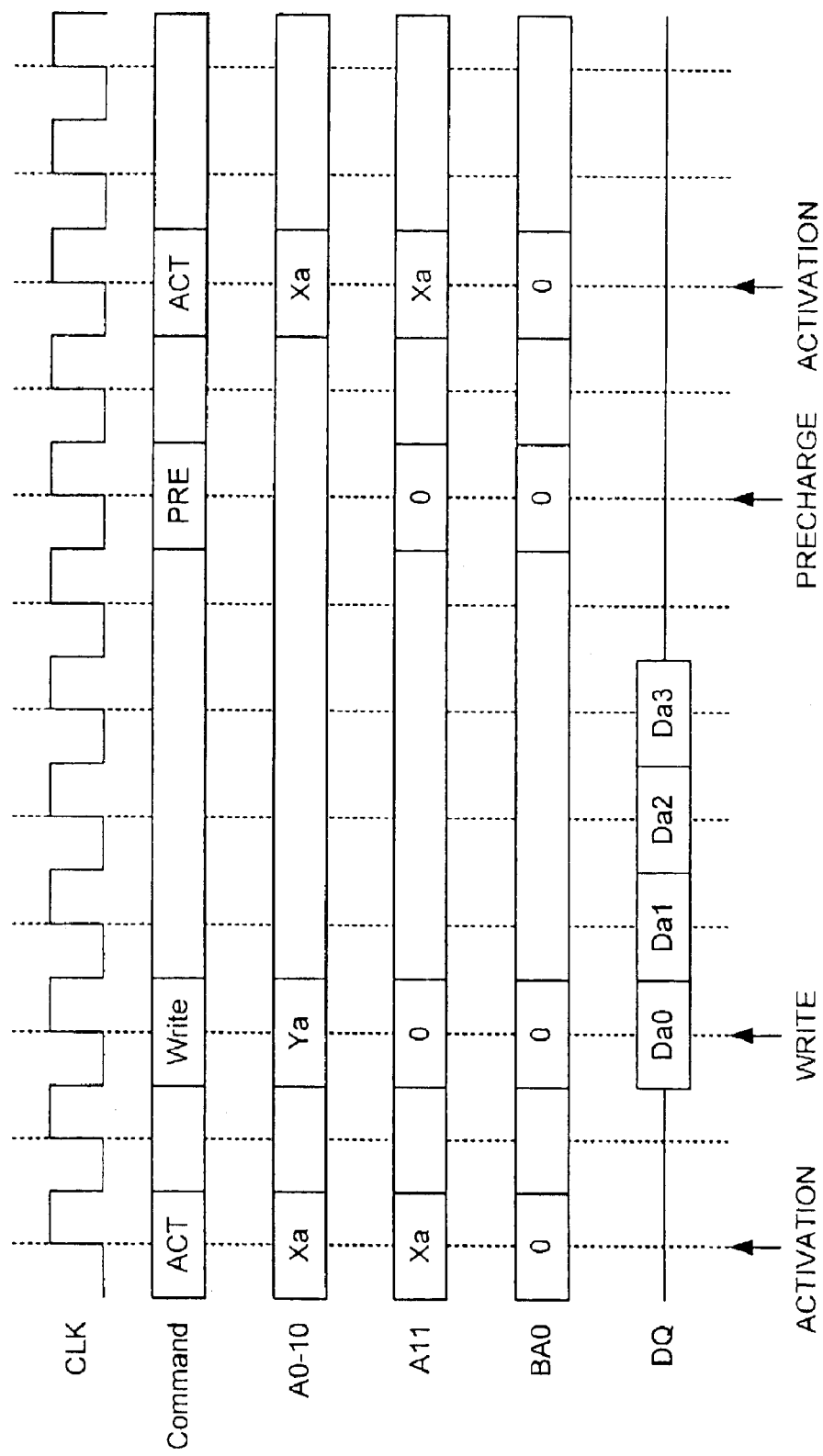
FIG. 6 shows a time chart of the write operation to the DRAM shown in FIG. 4.
Figure 7:
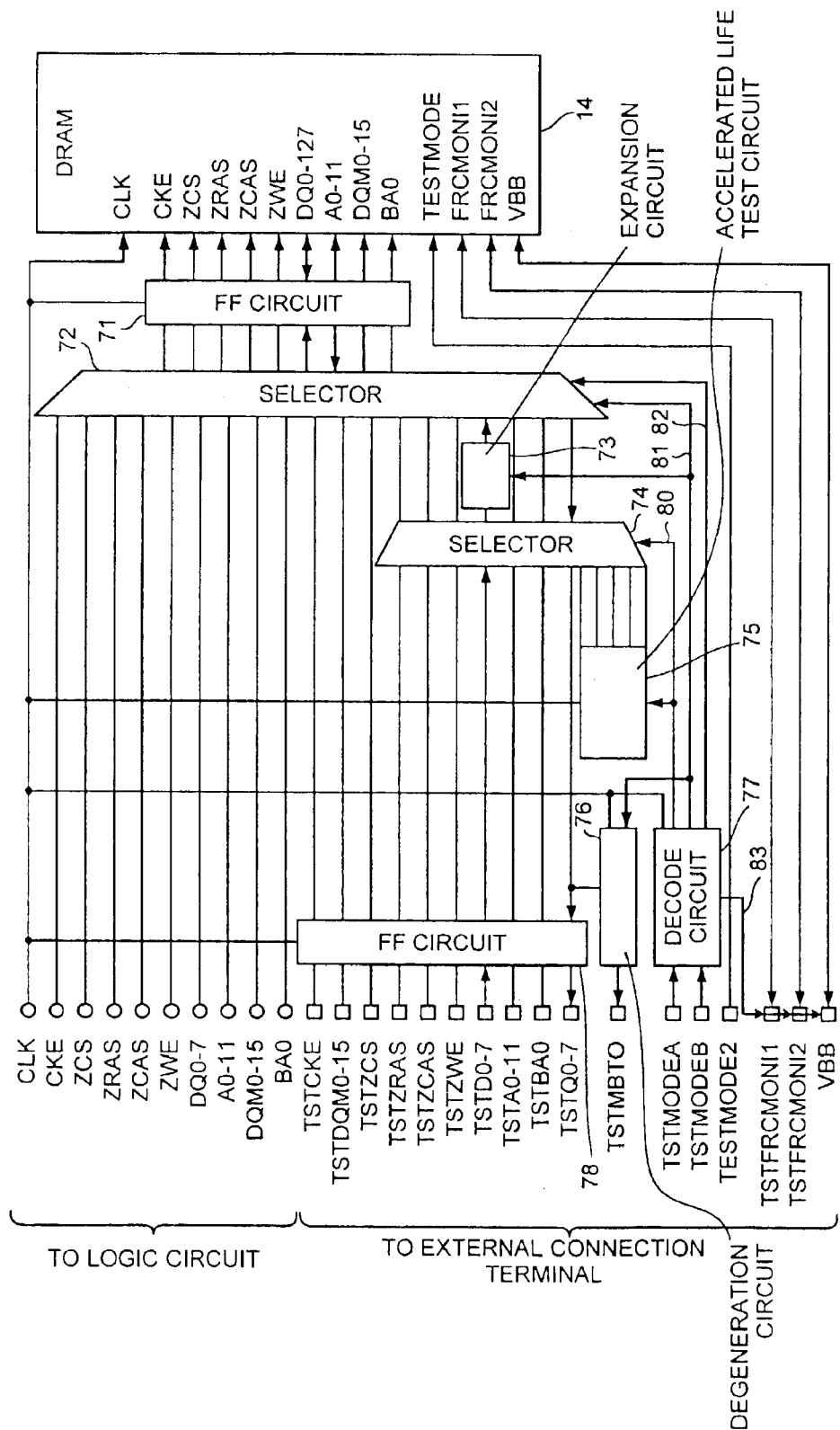
FIG. 7 shows a block diagram of a specific configuration example of the test circuit shown in FIG. 2.
Figure 8:
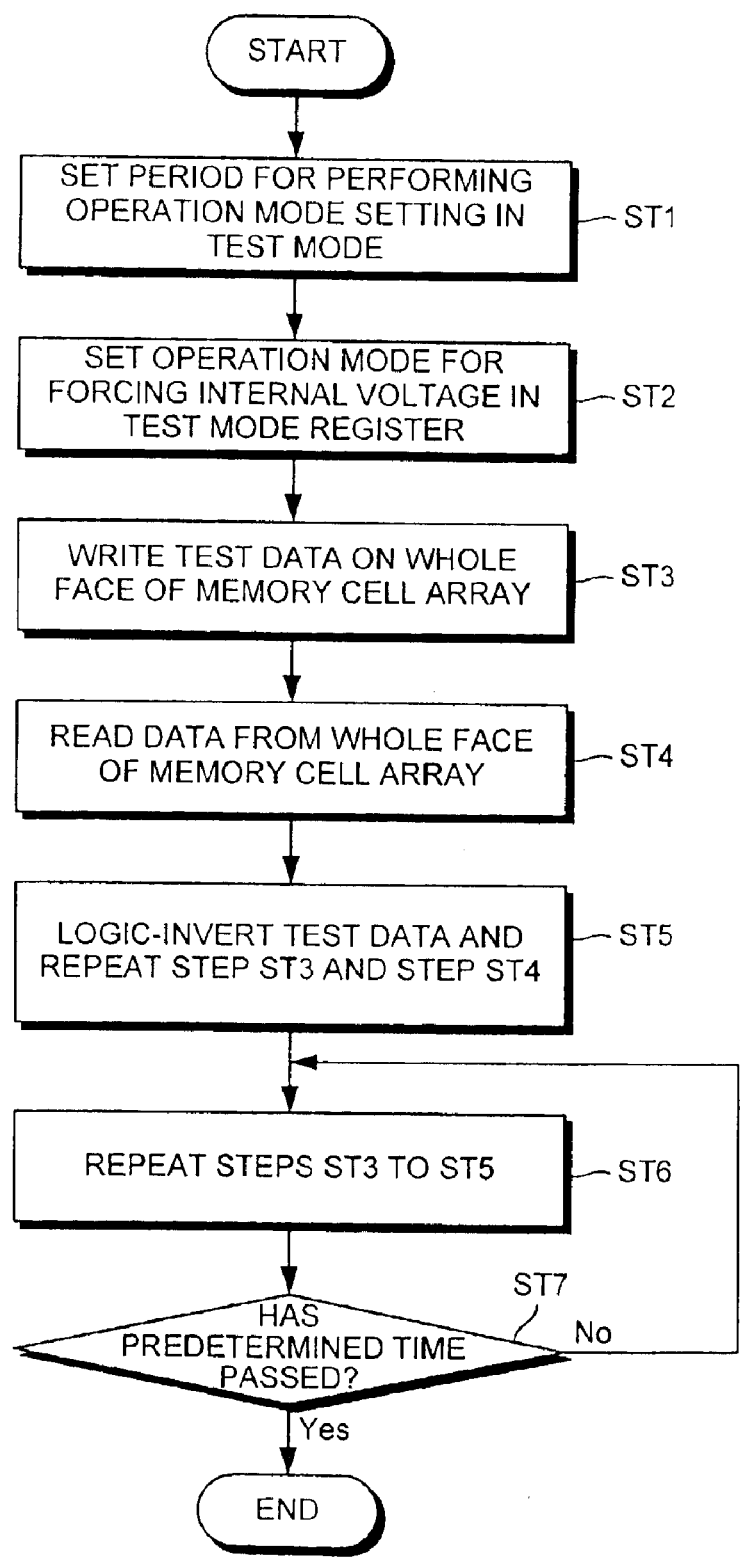
FIG. 8 shows a flowchart of the operation of an accelerated life test circuit shown in FIG. 7.
Figure 9:
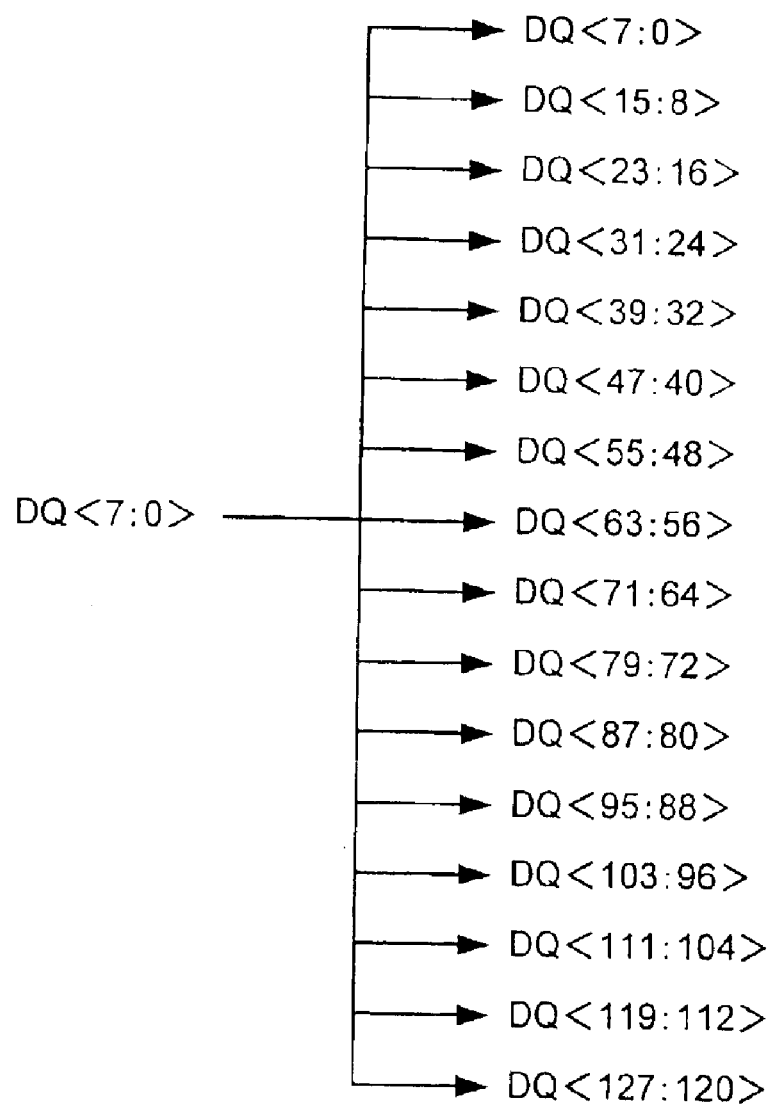
FIG. 9 shows the operation of an expansion circuit shown in FIG. 7.
Figure 10:
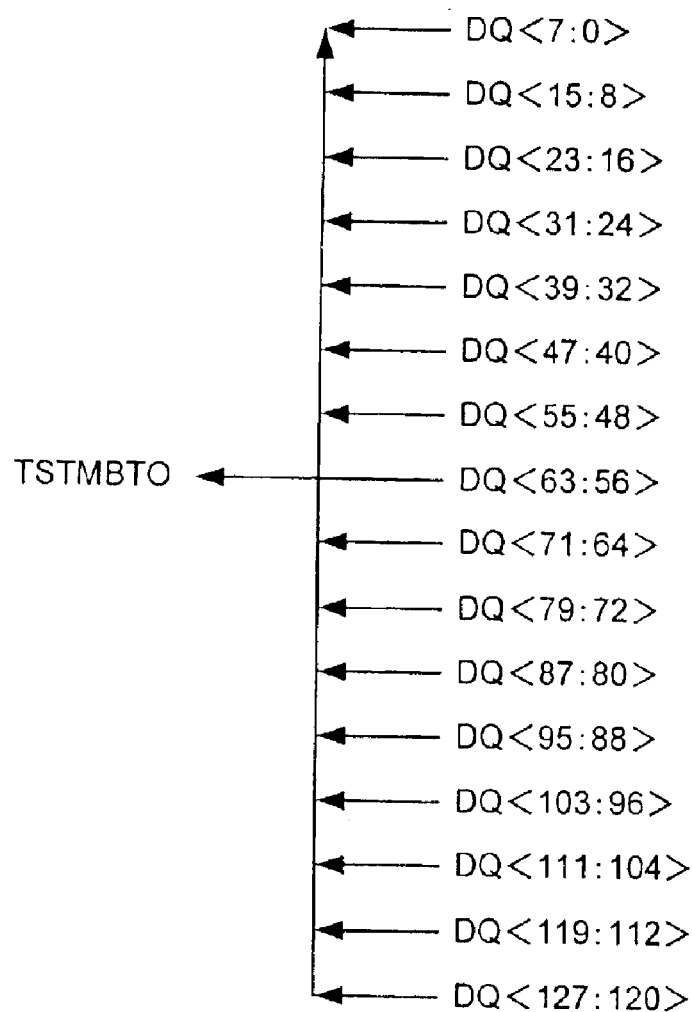
FIG. 10 shows the operation of a degeneration circuit shown in FIG. 7.

The test circuit 16 is specifically explained with reference to FIG. 4 to FIG. 8. FIG. 4 shows a block diagram of a configuration example of a DRAM constituting the memory circuit 14 shown in FIG. 2. FIG. 5 and FIG. 6 show time charts of the read/write operation from/to the DRAM shown in FIG. 4, respectively. FIG. 7 shows a block diagram of a specific configuration example of the test circuit 16 shown in FIG. 2. FIG. 8 shows a flowchart of the operation of an accelerated life test circuit 75 shown in FIG. 7. FIG. 9 shows the operation of a expansion circuit 73 shown in FIG. 7. FIG. 10 shows the operation of a degeneration circuit 76 shown in FIG. 7. In FIG. 7, the built-in self-test (BIST) function is omitted.

The DRAM as the memory circuit 14 shown in FIG. 4 comprises two memory cell arrays 55 and 56. Each of the memory cell arrays 55 and 56 has a capacity of 32 megabytes (Mb). One memory cell array 55 is designated as bank 0, and the other memory cell array 56 is designated as bank 1.

The DRAM comprises, as input and output terminals, an input terminal 41 for address signals A0 to A11, an input terminal 42 for a bank selection signal BA0 that specifies either bank 0 or bank 1, an input terminal 43 for an operation clock CLK, an input terminal 44 for a control signal CKE that switches over the used state of the operation clock CLK, an input terminal 45 for a chip selection signal ZCS, an input terminal 46 for a row address strobe signal ZRAS, an input terminal 47 for a column address strobe signal ZCAS, an input terminal 48 for a write enable signal ZWE, an input terminal 49 for write data signals DQM0 to DQM15, and an output terminal 50 for read data signals DQ0 to DQ127. The bank selection signal BA0 specifies bank 0. When bank 1 is to be specified, the bank selection signal becomes BA1.

The DRAM also comprises a clock buffer 51, an address buffer 52, a control signal buffer 53, a control circuit 54, and an I/O buffer 57, as peripheral circuits of the two memory cell arrays 55 and 56.

The clock buffer 51 outputs a signal obtained by taking a logic product of the operation clock CLK and the control signal CKE respectively input from the input terminals 43 and 44, to the address buffer 52, the control signal buffer 53, and to the control circuit 54. The address buffer 52 outputs the address signals A0 to A11 and the bank selection signal BA0 input from the input terminals 41 and 42 to the control circuit 54, according to the output of the clock buffer 51.

The control signal buffer 53 outputs the chip selection signal ZCS, the row address strobe signal ZRAS, the column address strobe signal ZCAS, the write enable signal ZWE, and the write data signals DQM0 to DQM15, respectively input from the input terminals 45 to 49 to the control circuit 54 according to the output of the clock buffer 51.

The control circuit 54 acquires each output signal of the address buffer 52 and the control signal buffer 53 according to the output of the clock buffer 51, and controls write and read to and from the memory cell arrays 55 and 56 based on these output signals. The I/O buffer 57 outputs the read data from the memory cell arrays 55 and 56 to the output terminal 50.

In FIG. 5 and FIG. 6, commands such as activation "ACT" and precharge "PRE" are issued by a combination of signals shown below. Activation "ACT" is issued under conditions of ZRAS=L and ZCAS=ZWE=H. Read "READ" is issued under conditions of ZRAS=H, ZCAS=L, and ZWE=H. Write "Write" is issued under conditions of ZRAS=H, and ZCAS=ZWE=L. Precharge "PRE" is issued under conditions of ZRAS=L, ZCAS=H, and ZWE=L.

FIG. 5 shows that after activation "ACT" of bank 0 and activation "ACT" of bank 1 shown in FIG. 4 have been carried out, read "READ" is carried out from bank 1, to thereby output read data DQ "Qb0, Qb1, Qb2, Qb3". During this process, precharge "PRE" for both of bank 0 and bank 1 is carried out, to shift to activation "ACT" of bank 0.

In FIG. 6, it is shown that after activation "ACT" of bank 0 shown in FIG. 4 has been carried out, write "Write" of the write data DQ "Qa0, Qa1, Qa2, Qa3" to bank 0 is carried out. Thereafter, precharge "PRE" is carried out for bank 0, to shift to activation "ACT" of bank 0. The operation shown in FIGS. 5 and 6 is carried out between the logic circuit 15 and the memory circuit 14 in the normal operation mode, and carried out between the test circuit 16 and the memory circuit 14 in the test mode.

In FIG. 7, the DRAM, as the memory circuit 14, has the configuration shown in FIG. 4, but four monitor terminals "TESTMODE", "FRCMONI1", "FRCMONI2", and "VBB" are added to the configuration. Though not shown in FIG. 7, an operating power source VDD and an external power source EXVDD are provided therein.

In the test circuit shown in FIG. 7, the operation clock CLK, the control signal CKE, the chip selection signal ZCS, the row address strobe signal ZRAS, the column address strobe signal ZCAS, the write enable signal ZWE, the read data signals DQ0 to DQ7, the address signals A0 to A11, the write data signals DQM0 to DQM15, and the bank selection signal BA0 are shown as the input and output signals to and from the logic circuit 15.

The operation clock CLK is input to the DRAM as the memory circuit 14, an FF circuits 71 and 78 formed of a flip-flop (hereinafter referred to as "FF"), the accelerated life test circuit 75, the degeneration circuit 76, and a decode circuit 77. All the remaining signals are input to the selector 72.

In the test circuit shown in FIG. 7, a test control signal TSTCKE, test write data TSTDQM0 to TSTDQM15, a test chip selection signal TSTZCS, a test row address strobe signal TSTZRAS, a test column address strobe signal TSTZCAS, a test write enable signal TSTZWE, a test write data signals TSTD0 to TSTD7, test address signals TSTA0 to TSTA11, a test bank selection signal TSTBA0, test read data signals TSTQ0 to TSTQ7, a multi-bit test output signal TSTMBTO, test mode signals TSTMODEA, TSTMODEB, and TSTMODE2, and voltage force monitor signals TSTFRCMONI1, TSTFRCMONI2, and VBB are shown as the input and output signals to and from the external connection terminal.

Of these, respective terminals for the test control signal TSTCKE, the test write data TSTDQM0 to TSTDQM15, the test chip selection signal TSTZCS, the test row address strobe signal TSTZRAS, the test column address strobe signal TSTZCAS, the test write enable signal TSTZWE, the test write data signals TSTD0 to TSTD7, the test address signals TSTA0 to TSTA11, the test bank selection signal TSTBA0, and the test read data signals TSTQ0 to TSTQ7 are connected to the FF circuit 78.

The FF circuit 78 outputs respective signals of the test control signal TSTCKE, the test write data TSTDQM0 to TSTDQM15, and the test chip selection signal TSTZCS to the selector 72. The FF circuit 78 also outputs respective signals of the test row address strobe signal TSTZRAS, the test column address strobe signal TSTZCAS, the test write enable signal TSTZWE, the test write data signals TSTD0 to TSTD7, the test address signals TSTA0 to TSTA11, and the test bank selection signal TSTBA0 to the selector 74. Further, the FF circuit 78 outputs the test read data signals DQ0 to DQ127 input from the selector 74 to respective terminals corresponding to 8-bit test read data signals TSTQ0 to TSTQ7. The test read data signals DQ0 to DQ127 output by the selector 74 are also input to the degeneration circuit 76.

The terminal for the multi-bit test output signal TST-MBTO is connected to the output end of the degeneration circuit 76. The terminal for the test mode signal TST-MODE2 is connected to the test mode terminal TETMODE of the DRAM as the memory circuit 14. Respective terminals for the voltage force monitor signals TSTFRCMONI1, TSTFRCMONI2, and VBB are connected to the corresponding monitor output terminals FRCMONI1, FRCMONI2, and VBB of the DRAM as the memory circuit 14, respectively.

The respective terminals for the test mode signals TST-MODEA and TSTMODEB are connected to the input ends of the decode circuit 77. The decode circuit 77 generates four signals 80, 81, 82, and 83 from these signals. The signal 80 is an accelerated test signal, and is input to the accelerated life test circuit 75 and the selector 74. The signal 81 is a multi-bit test signal, and is input to the degeneration circuit 76, the expansion circuit 73, and the selector 72. The signal 82 is a signal indicating whether to carry out a test, and is input to the selector 72. The signal 83 is a voltage monitor enable signal, and is used to turn ON or OFF the respective terminals for the voltage force monitor signals TSTFRCMONI1, TSTFRCMONI2, and VBB.

The accelerated life test circuit 75 receives the accelerated test signal 80, and generates an address signal, a data signal, and a control signal necessary for the accelerated test, and outputs these signals to the selector 74. The selector 74 receives the accelerated test signal 80, and selects the output of the accelerated life test circuit 75 and outputs the selected output to the selector 72. Further, the selector 74 provides the test read data signals DQ0 to DQ127 output by the selector 72 to the FF circuit 78 and the degeneration circuit 76 as explained above.

The expansion circuit 73 receives the multi-bit test signal 81, performs expansion processing (see FIG. 9) on the test write data signals TSTD0 to TSTD7 input from the selector 74, and outputs these signals to the selector 72. The degeneration circuit 76 receives the multi-bit test signal 81, performs degeneration processing (see FIG. 10) on the test write data signals DQ0 to DQ127 input from the selector 74, and outputs these signals to the corresponding terminals, as the multi-bit test output signal TSTMBTO.

The FF circuit 71 controls the transfer of the respective signals of the control signal CKE, the chip selection signal ZCS, the row address strobe signal ZRAS, the column address strobe signal ZCAS, the write enable signal ZWE, the read data signals DQ0 to DQ127, the address signals A0 to A11, the write data signals DQM0 to DQM15, and the bank selection signal BA0, between the DRAM as the memory circuit 14 and the selector 72.

When the signal 82 indicating whether to carry out a test indicates not to carry out the test, that is, the normal operation mode, the selector 72 establishes a connection between the input end of the logic circuit 15 and the FF circuit 71. When the signal 82 indicates to carry out the test, that is, the test mode, the selector 72 establishes a connection among the FF circuit 78, the selector 74, the expansion circuit 73, and the FF circuit 71.

In this configuration, respective operations of the accelerated life test circuit 75, the expansion circuit 73, and the degeneration circuit 76 are explained. At first, the operation of the accelerated life test circuit 74 is explained with reference to FIG. 8.

In FIG. 8, at step ST1, the accelerated life test circuit 75 sets a period in which the operation mode in the test mode is set, upon receipt of the accelerated test signal 80. This is for selecting, for example, one clock period of the operation clock CLK after a suitable period of time since the chip selection signal ZCS, the row address strobe signal ZRAS, the column address strobe signal ZCAS, the write enable signal ZWE, the address signals A0 to A11, the bank selection signal BA0, and the like disappear.

At step ST2, though a plurality of internal power sources exists in the DRAM, the accelerated life test circuit 75 sets the operation mode for multiplying (forcing) the internal voltage in a test mode register provided in the DRAM. Various operation modes are prepared, and therefore optionally forced various internal voltages can be obtained by setting an optional operation mode from outside, using the address signals TSTA0 to TSTA11, the bank selection signal TSTBA0, and the like.

As the operation mode for obtaining one forced internal voltage, the following signals are set in the test mode register in the following order, that is, a mode signal TMRBIALLBNK for operating all banks at the same time, a mode signal TMBTB for expansion and degeneration (multi-bit test), a mode signal TMRAB125 that is one of the special operations at the time of accelerated life test, a mode signal TMVREFSFRC for forcing a reference voltage VREFS that generates the operation voltage for the memory cell array section, and a mode signal TMVDDEXVDD for short-circuiting the operating power source VDD and the external power source EXVDD in the DRAM.

As a result, for example, when 3.65 volts is provided from the external power source EXVDD, a word line voltage VPP becomes 4.8 volts, and the operating voltage VCCS for the memory cell array section and the operating voltage VCCP for the peripheral circuit become both 3.75 volts. The value of the internal voltage forced in this manner can be monitored at the respective terminals for the voltage force monitor signals TSTFRCMONI1, TSTFRCMONI2, and VBB.

Specifically, at the terminal for the voltage force monitor signal VBB, normally −1.0 volt is observed. At the terminal for the voltage force monitor signal TSTFRCMONI1, the reference voltage VREFS and a voltage VCP applied on the cell plate are monitored. At the terminal for the voltage force monitor signal TSTFRCMONI2, the reference voltage VREFP that generates the operating voltage VCCP for the peripheral circuit, the reference voltage VREFD that generates the word line voltage VPP, and a bit line voltage VBL are monitored.

At step ST3, test data is written on the whole face of the memory cell array {<X, Y>=<0, 0> to <Xmax, Ymax>}. This is performed by repeating at first to access a row address while adding 1 thereto, and when the row address becomes full, allow it to return 0, and then add 1 to a column address, and access the row address again, while adding 1 thereto. Scrambling is applied to the address signal and the data signal.

At step ST3, data is read from the whole face of the memory cell array {<X, Y>=<0, 0> to <Xmax, Ymax>}. This read operation is performed in the same procedure as that of the write operation. The read data is output from the terminals for the test read data signals TSTQ0 to TSTQ7, and quality decision is performed by the cell checker.

At step ST4, the test data is logic-inverted, to repeat step ST3 and step ST4. Steps ST3 to ST5 are repeated for predetermined time, in order to maintain the stressed state for the predetermined time (steps ST6 and ST7).

In FIG. 9, in the expansion circuit 73, a test data signal DQ<7:0> in a unit of 8 bits input from the selector 74 is copied, to respectively generate 16 test data signals DQ<7:0> to DQ<127:120> in a unit of 8 bits, and these are arranged in parallel and output to the selector 72. These signals are then input to the terminals for the write data signals DQ0 to DQ127 in the DRAM.

In FIG. 10, the degeneration circuit 76 sequentially receives the test data signals DQ<7:0> to DQ<127:120> in a unit of 8 bits input from the selector 74, and compares the top test data signal DQ<7:0> with the subsequent each test data signal DQ for each 8 bits by the exclusive OR operation. If all of the 8 bits agree with each other, the multi-bit test output signal TSTMBO is set to "H" level, and if not, the multi-bit test output signal TSTMBO is set to "L" level.

In other words, in the degeneration circuit 76, a multi-bit test output signal TSTMBO obtained by degenerating 16 test data signals DQ<7:0> to DQ<127:120> in a unit of 8 bits to 16 bits is output. The multi-bit test output signal TSTMBO is a signal indicating the result of quality decision.

According to the first embodiment, the logic chip is provided with the test circuit that prohibits the logic circuit from using the path for accessing the memory circuit on the memory chip and accesses the memory circuit by itself. As a result, a memory test can be conducted by issuing an instruction from an external connection terminal to the test circuit. Further, the internal voltage of the DRAM as the memory circuit is forced to thereby conduct the accelerated life test, and the multi-bit test can be also conducted.

The test circuit can be constructed so as to prohibit the logic circuit from using the path for accessing the memory circuit on the memory chip and access the memory circuit by itself, at the time of power on and at any time thereafter as required. Therefore, in such a situation, the built-in self-test (BIST) can be conducted to allow the test circuit to have a function of detecting error bit. It is noted that the number of external connection terminals provided for the test can be reduced.

Figure 11:
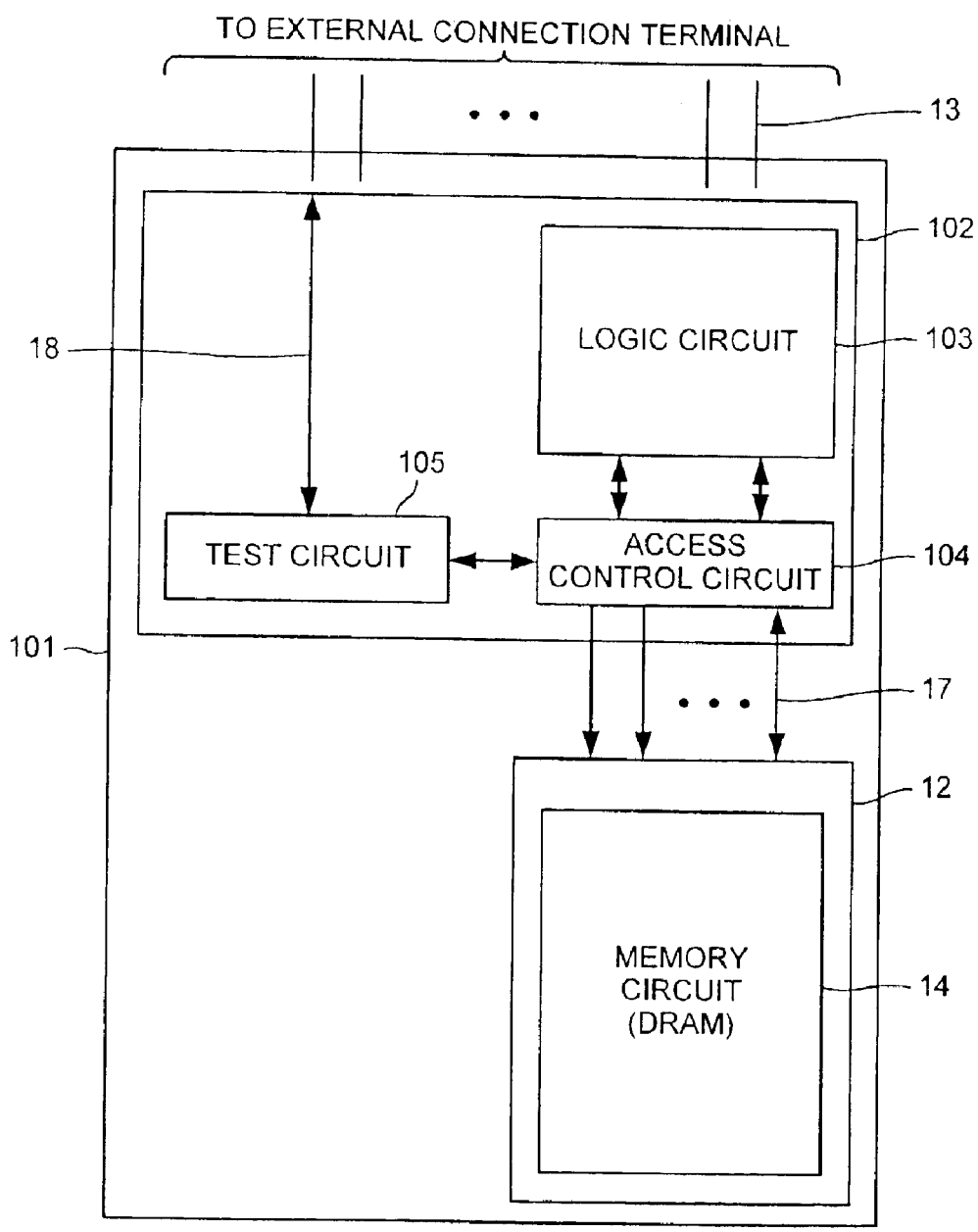
FIG. 11 shows a conceptual diagram of the SiP type semiconductor device, being a second embodiment of the present invention.

FIG. 11 shows a conceptual diagram of the SiP type semiconductor device, being a second embodiment of the present invention. In FIG. 11, the same or equivalent constituents as those shown in FIG. 2 are denoted by the same reference symbols. The part relating to the second embodiment is mainly explained below.

In the SiP type semiconductor device 101 shown in FIG. 11, in the configuration shown in FIG. 2, a logic chip 102 is provided, instead of the logic chip 11. In the logic chip 102, the logic circuit 15 shown in FIG. 2 is separated into an original logic circuit 103 and an access control circuit 104 that controls access to the memory circuit 14. The access control circuit 104 is constructed so as to switch over the control entity from outside, and is arranged at a position where the test circuit 16 is arranged in FIG. 2. A test circuit 105, to which a test signal 18 is input from an external connection terminal, is arranged so that the test circuit 105 can control the switchover of the control entity of the access control circuit 104.

In other words, when the mode signal included in the test signal 18 indicates the "normal operation mode", the test circuit 105 switches the control entity of the access control circuit 104 to the logic circuit 103, thereby enabling the access from the logic circuit 103 to the memory circuit 14.

On the other hand, when the mode signal indicates the "test mode", the test circuit 105 switches the control entity of the access control circuit 104 to the own test circuit 105. The test circuit 105 uses the access control circuit 104 to access the memory circuit 14, and conducts the test explained in the first embodiment and the accelerated life test.

In other words, in the case of the accelerated life test, the test circuit 105 switches the control entity of the access control circuit 104 to the own test circuit 105. The test circuit 105 then uses the access control circuit 104 to perform the processing shown in FIG. 8.

When the mode signal indicates the "multi-bit test mode", the test circuit 105 switches the control entity of the access control circuit 104 to the own test circuit 105. The test circuit 105 then uses the access control circuit 104 to write the expanded test data in the memory circuit 14, and uses the access control circuit 104 to degenerate the test data read from the memory circuit 14, to perform quality decision, and outputs a signal indicating the decision result to the external connection terminal together with the read test data signal.

At the time of power on and at any time thereafter, the test circuit 105 can conduct a built-in self-test (BIST), in such a manner that the test circuit 105 switches the control entity of the access control circuit 104 to the own test circuit 105, generates various test patterns, writes the patterns in the memory circuit 14 using the access control circuit 104, and compares the write data with the data read by using the access control circuit 104, to thereby detect a defective bit. In this BIST, quality decision is carried out, and a signal indicating the decision result is output to the external connection terminal, together with the read test data signal.

When the test circuit 105 has the built-in self-test (BIST) function, as in the first embodiment, for example, a second memory chip is provided in the SiP type semiconductor device 101, and the address information for a defective bit detected at the time of BIST, is stored in the second memory circuit mounted on the second memory chip.

According to the second embodiment, the access control circuit equipped in the logic circuit is constructed and arranged such that the access control circuit can be controlled so as to switch the control entity of the access control circuit from the test circuit, and therefore it is possible to conduct various tests in the same manner as that of the first embodiment using the access control circuit used at the time of normal operation.

Figure 12:
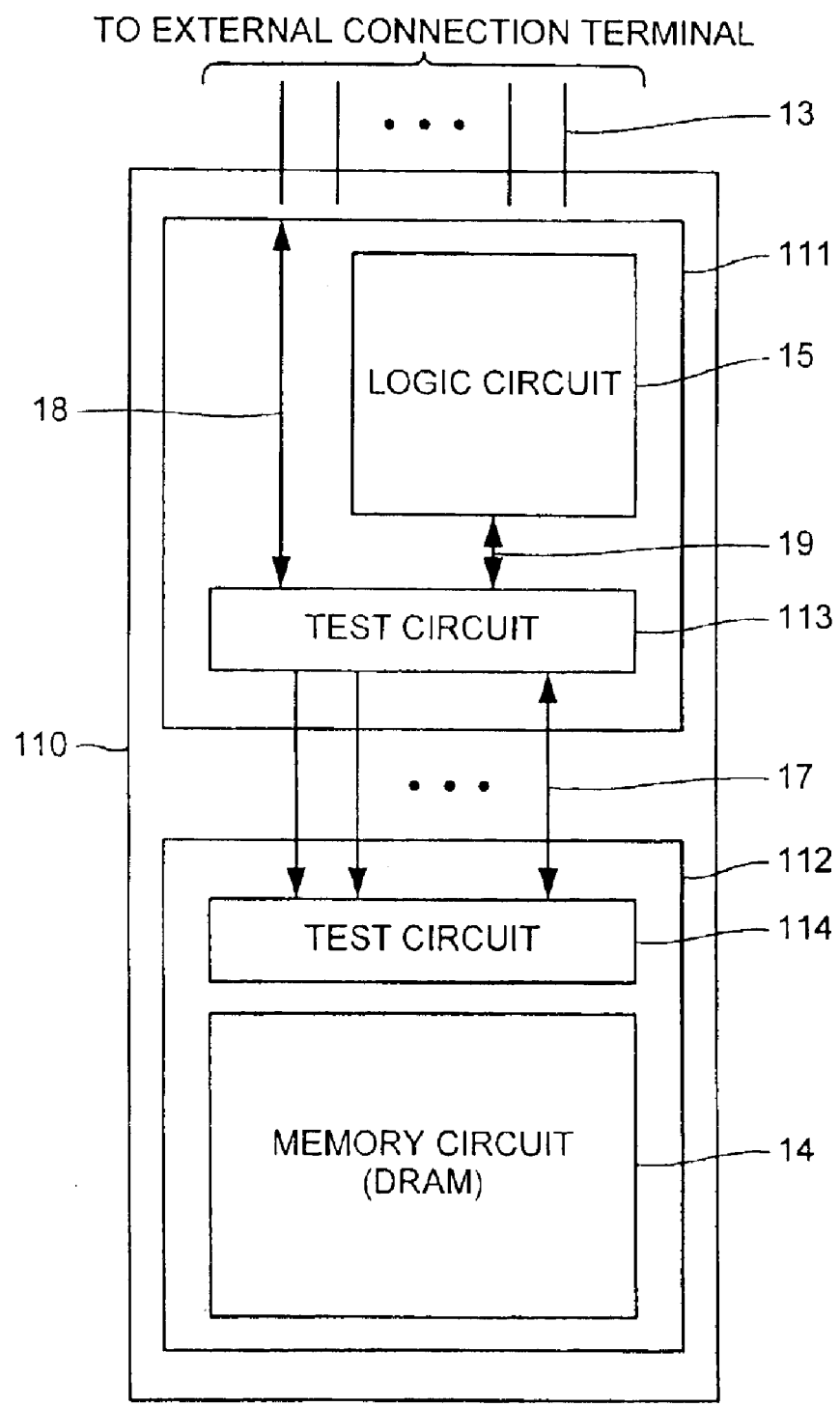
FIG. 12 shows a conceptual diagram of the SiP type semiconductor device, being a third embodiment of the present invention.

FIG. 12 shows a conceptual diagram of the SiP type semiconductor device, being a third embodiment of the present invention. In FIG. 12, the same or equivalent constituents as those shown in FIG. 2 are denoted by the same reference symbols. The part relating to the third embodiment is mainly explained below.

In the SiP type semiconductor device 110 shown in FIG. 12, a logic chip 111 is provided instead of the logic chip 11, and a memory chip 112 is provided instead of the memory chip 12, in the configuration shown in FIG. 2.

In the logic chip 111, a test circuit 113 is provided instead of the test circuit 16 in the logic chip 11 shown in FIG. 2. Further, in the memory chip 112, a test circuit 114 connected to the memory circuit 14 shown in FIG. 2 is provided. In other words, the test circuit 114 is obtained by adding some functions to the circuit used at the time of testing the memory chip 112 in the wafer state, and is provided so as to intervene between the test circuit 113 and the memory circuit 14. As a result, the test circuit 113 and the test circuit 114 are connected to each other through the wiring 17.

The test circuit 113 directly transfers a mode signal included in the test signal 18 to the test circuit 114, performs the switchover operation between the normal operation mode and the test mode based on the mode signal, and also performs an operation to issue a test instruction to the test circuit 114 on the memory chip 112.

In other words, when the mode signal included in the test signal 18 indicates the "normal operation mode", the test circuit 113 directly connects the logic circuit 15 to the wiring 17, so that the logic circuit 15 can transmit an output signal 19 or the like onto the wiring 17.

On the other hand, when the mode signal indicates the "test mode" and "accelerated life test", the test circuit 113 directly connects a built-in "control circuit issuing a test instruction" to the wiring 17, to transmit a corresponding test instruction and test data onto the wiring 17.

At the time of power on and at any time thereafter, the test circuit 113 directly connects the built-in "control circuit issuing a test instruction" to the wiring 17, to transmit a built-in self-test (BIST) instruction and test data from the "control circuit issuing a test instruction" onto the wiring 17.

When the mode signal transmitted from the test circuit 113 indicates the "normal operation mode", the test circuit 114 directly connects the wiring 17 to the memory circuit 14, which allows the logic circuit 15 to access the memory circuit 14.

On the other hand, when the mode signal transmitted from the test circuit 113 indicates the "test mode" and "accelerated life test", the test circuit 114 takes in the test instruction transmitted from the "control circuit issuing a test instruction" of the test circuit 113, through the wiring 17. Based on the test instruction relating to the "test mode", the test circuit 114 accesses the memory circuit 14 in response to the instruction, to conduct the test explained in the first embodiment and the accelerated life test, and outputs the result data to the "control circuit issuing a test instruction" of the test circuit 113.

Based on the instruction of "multi-bit test mode", the "control circuit issuing a test instruction" of the test circuit 113 transmits the expanded test data, and hence the test circuit 114 writes the data in the memory circuit 14, and reads the data from the memory circuit 14 to output the data to the "control circuit issuing a test instruction" of the test circuit 113. The "control circuit issuing a test instruction" of the test circuit 113 degenerates the received test data, to decide the quality, and outputs a decision result signal to the external connection terminal together with the read test data signal.

Each time when the built-in self-test (BIST) instruction is input, the test circuit 114 writes the test pattern data transmitted from the "control circuit issuing a test instruction" of the test circuit 113 in the memory circuit 14, reads the data from the memory circuit 14, and outputs the data to the "control circuit issuing a test instruction" of the test circuit 113. The "control circuit issuing a test instruction" of the test circuit 113 compares the received test data with the sent test data, to decide the quality, and outputs a decision result signal to the external connection terminal together with the received test data signal.

When the test circuit 114 has the built-in self-test (BIST) function, as in the first embodiment, for example, a second memory chip is provided in the SiP type semiconductor device 110, and the address information for a defective bit detected at the time of BIST is stored in the second memory circuit mounted on the second memory chip.

According to the third embodiment, the test circuit is provided both in the logic chip and the memory chip, and therefore a test can be directly conducted singly on the memory chip from outside. Further, it is possible to perform setting for changing the internal voltage variously in the test circuit on the memory chip and decide whether good quality is maintained after the accelerated life test is conducted. As a result, the accuracy of the test can be further increased.

Figure 13:
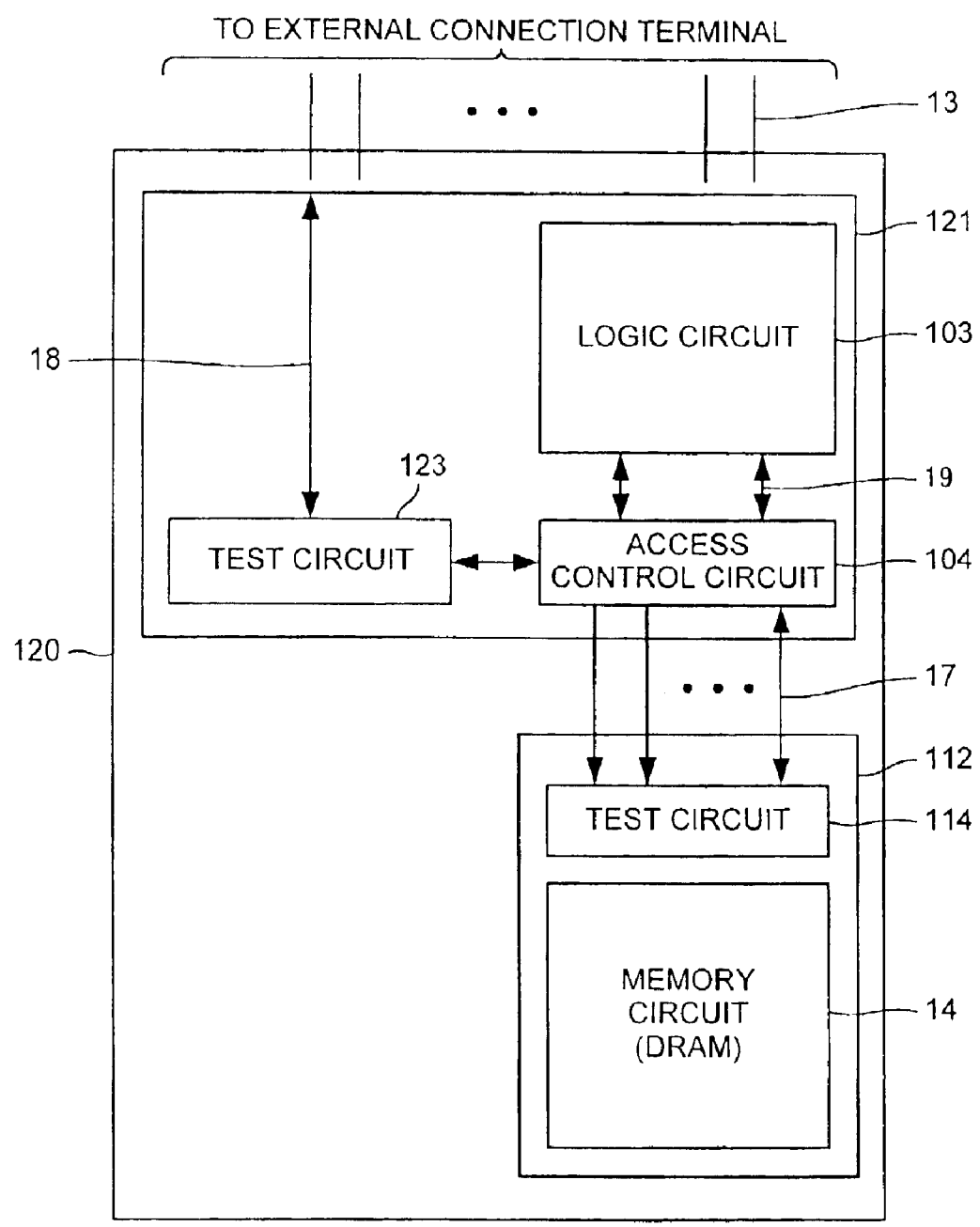
FIG. 13 shows a conceptual diagram of the SiP type semiconductor device, being a fourth embodiment of the present invention.

FIG. 13 shows a conceptual diagram of the SiP type semiconductor device, being a fourth embodiment of the present invention. In FIG. 13, the same or equivalent constituents as those shown in FIG. 2, FIG. 11, and FIG. 12 are denoted by the same reference symbols. The part relating to the fourth embodiment is mainly explained below.

The SiP type semiconductor device 120 shown in FIG. 13 comprises a logic chip 121 and the memory chip 112 shown in FIG. 12. In the logic chip 121, a test circuit 123 is provided instead of the test circuit 105 in the configuration shown in FIG. 11. The test circuit 114 on the memory chip 112 is connected to the access control circuit 104 via the wiring 17.

The test circuit 123 directly transfers a mode signal included in the test signal 18 to the test circuit 114 via the access control circuit 104, and when the mode signal included in the test signal 18 indicates the "normal operation mode", the test circuit 123 switches the control entity of the access control circuit 104 to the logic circuit 103. Thereby, the output signal 19 or the like of the logic circuit 103 can be transmitted from the access control circuit 104 onto the wiring 17.

On the other hand, when the mode signal indicates the "test mode" and "accelerated life test", the test circuit 123 switches the control entity of the access control circuit 104 to the own test circuit 123. The test circuit 123 then uses the access control circuit 104 to transmit the corresponding test instruction onto the wiring 17. At the time of power on or at any time thereafter, the test circuit 123 switches the control entity of the access control circuit 104 to the own test circuit 123, and transmits the built-in self-test (BIST) instruction onto the wiring 17, using the access control circuit 104.

When the mode signal transmitted from the test circuit 123 via the access control circuit 104 indicates the "normal operation mode", the test circuit 114 directly connects the wiring 17 to the memory circuit 14, which allows the logic circuit 103 to access the memory circuit 14.

On the other hand, when the mode signal transmitted from the test circuit 123 via the access control circuit 104 indicates the "test mode" and "accelerated life test", the test circuit 114 takes in the test instruction transmitted from the access control circuit 104 from the wiring 17. Based on the test instruction relating to the "test mode", the test circuit 114 accesses the memory circuit 14 in response to the instruction, to conduct the test explained in the first embodiment and the accelerated life test, and outputs the result data to the test circuit 123 via the access control circuit 104.

At the time of the instruction of "multi-bit test mode", the test circuit 123 transmits the expanded test data, and hence the test circuit 114 writes the data in the memory circuit 14, and reads the data from the memory circuit 14 to output the data to the test circuit 123 via the access control circuit 104. The test circuit 123 degenerates the received test data to decide the quality, and outputs a signal indicating decision result to the external connection terminal together with the read test data signal.

Each time when the built-in self-test (BIST) instruction is input from the test circuit 123 via the access control circuit 104, the test circuit 114 writes the test pattern data transmitted from the test circuit 123 via the access control circuit 104, in the memory circuit 14, reads the data from the memory circuit 14, and outputs the data to the test circuit 123 via the access control circuit 104. The test circuit 123 compares the received test data with the sent test data, to decide the quality, and outputs a signal indicating decision result to the external connection terminal together with the received test data signal.

When the test circuit 114 has the built-in self-test (BIST) function, as in the first embodiment, for example, a second memory chip is provided in the SiP type semiconductor device 120, and the address information of a defective bit detected at the time of BIST, is stored in the second memory circuit mounted on the second memory chip.

According to the fourth embodiment, as in the second embodiment, the test circuit can use the access control circuit equipped in the logic circuit separately from the logic circuit, and therefore a test of the memory chip can be singly performed from outside, using the access control circuit used at the time of normal operation. Further, the number of external connection terminals provided for the test can be reduced.

At this time, as in the third embodiment, the test circuit is provided both in the logic chip and the memory chip, and therefore it is possible to perform setting for changing the internal voltage variously in the test circuit on the memory chip and decide whether good quality is maintained after the accelerated life test is conducted. As a result, the accuracy of the test can be further increased.

In the fourth embodiment, the built-in self-test (BIST) circuit exists in the test circuit 123, but the present invention is not limited thereto, and it is a matter of course that the built-in self-test (BIST) circuit may be provided in the test circuit 114.

Figure 14:
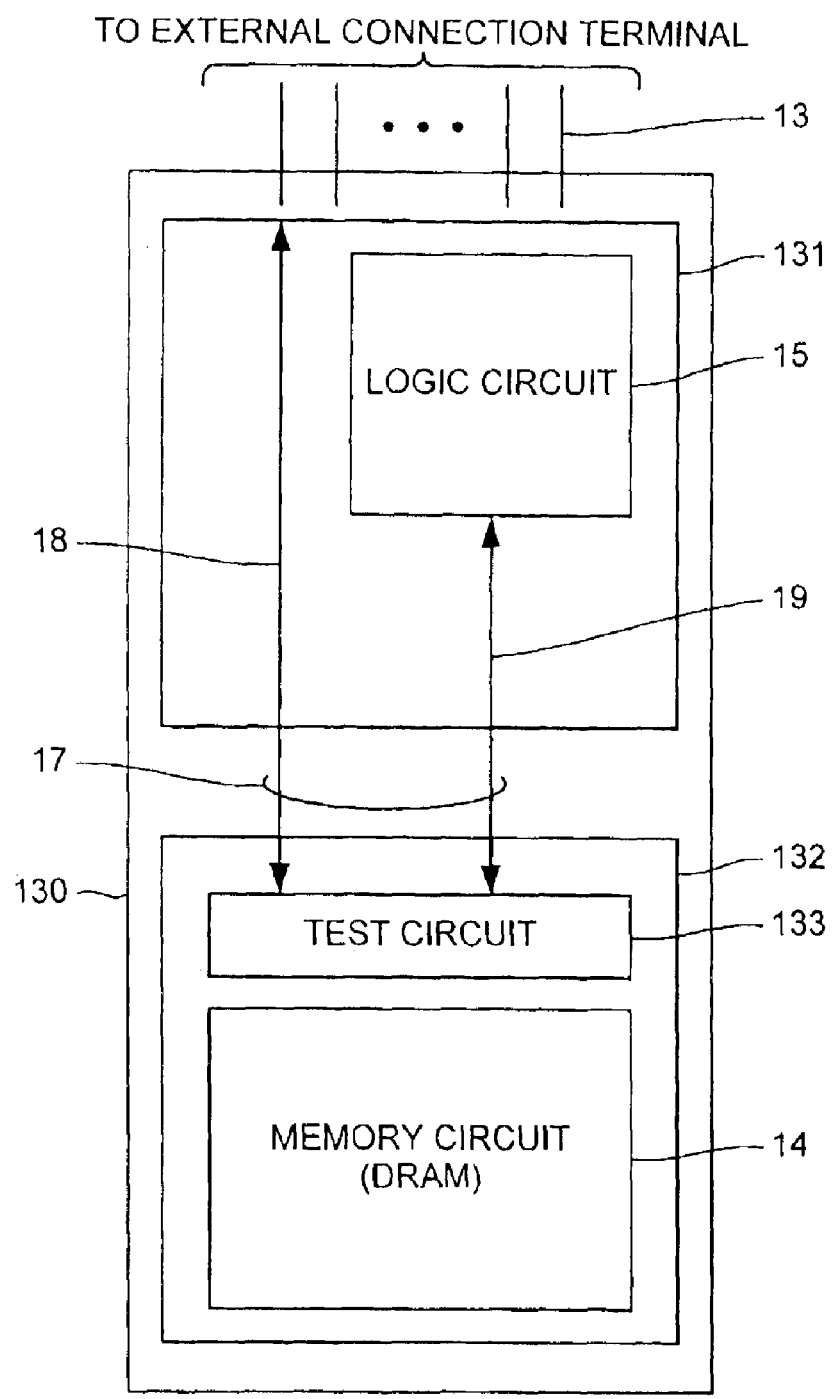
FIG. 14 shows a conceptual diagram of the SiP type semiconductor device, being a fifth embodiment of the present invention.

FIG. 14 shows a conceptual diagram of the SiP type semiconductor device, being a fifth embodiment of the present invention. In FIG. 14, the same or equivalent constituents as those shown in FIG. 2 are denoted by the same reference symbols. The part relating to the fifth embodiment is mainly explained below.

The SiP type semiconductor device 130 shown in FIG. 14 comprises a logic chip 131 and a memory chip 132. In the logic chip 131, the test circuit 16 in the logic chip 11 shown in FIG. 2 is omitted, so that the test signal 18 from an external connection terminal and the output signal 19 from the logic circuit 15 are directly sent out onto the wiring 17.

In the memory chip 132, a test circuit 133 connected to the memory circuit 14 shown in FIG. 2 is provided, and the wiring 17 is connected to the memory circuit 14 via the test circuit 133.

The test circuit 133 has the configuration shown in FIG. 3, so as to perform the similar operation to that of the test circuit 16 shown in FIG. 2. In other words, when the mode signal included in the test signal 18 from the external connection terminal indicates the "normal operation mode", the output signal 19 from the logic circuit 15 is directly supplied to the memory circuit 14.

On the other hand, when the mode signal indicates the "test mode" and "accelerated life test", the test circuit 133 connects the memory test circuit 21 shown in FIG. 3 to the memory circuit 14, to conduct the test, the accelerated life test circuit, or the multi-bit test. The test circuit 133 conducts the built-in self-test (BIST) at the time of power on or at any time thereafter.

When the test circuit 133 has the built-in self-test (BIST) function, as in the first embodiment, for example, a second memory chip is provided in the SiP type semiconductor device 130, and the address information for a defective bit detected at the time of BIST, is stored in the second memory circuit mounted on the second memory chip.

According to the fifth embodiment, the test circuit is provided on the memory chip so that the logic circuit is prohibited from using the path for accessing the memory circuit but the test circuit itself can access the memory circuit. Therefore, the internal voltage of the DRAM as the memory circuit is forced to enable conduction of the accelerated life test, by issuing an instruction from the external connection terminal to the test circuit, and the multi-bit test can be also conducted. Further, since the test circuit is provided on the memory chip side, more detailed test becomes possible than in the first embodiment, thereby increasing the test accuracy.

In each of the embodiments, the DRAM is shown as the memory circuit mounted on the memory chip. However, needless to say, the present invention is applicable to any of SiP type semiconductor devices having various configuration, regardless of combinations, such as an SiP type semiconductor device comprising a memory chip mounting, for example, an SRAM or a flash memory thereon and a logic chip, and an SiP type semiconductor device comprising a logic chip and a logic chip. At least the multi-bit test and the built-in self-test (BIST) can be conducted on the SRAM and the flash memory in the same manner as explained above.

According to this invention, the test circuit is provided on either the logic chip or the memory chip. The test circuit is configured to prohibit the logic circuit on the logic chip from using an access path to the memory circuit on the memory chip and to access the memory circuit by itself by using the access path, according to an instruction from outside. Therefore, it is possible to conduct any test, an accelerated life test, or a multi-bit test only on the memory chip from outside.

The test circuit can be configured such that at the time of power on and thereafter, the test circuit prohibits the logic circuit on the logic chip from using the access path to the memory circuit on the memory chip but accesses the memory circuit by itself by using the access path, to thereby conduct the built-in self-test.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A system-in-package type semiconductor device comprising:

a memory chip for mounting a memory circuit thereon;

a logic chip for mounting a logic circuit thereon, electrically connected to the memory circuit, the logic circuit and an external connection terminal of a package being connected to each other to be sealed; and a test circuit directly connected to the external connection terminal and provided on either the logic chip or the memory chip and for conducting various types of tests by allowing the logic circuit to use an access path to the memory circuit when a mode signal input from a mode terminal provided in the external connection terminal indicates a normal operation mode, or by prohibiting the logic circuit from using the access path and accessing the memory circuit itself when the mode signal indicates a test mode or when instructed via the external connection terminal.

2. The system-in-package type semiconductor device according to claim 1, further comprising an access control circuit provided in the logic circuit and for controlling access to the memory circuit, wherein when the test circuit is disposed on the logic chip, the test circuit can control the access control circuit so as to select which of the logic circuit and the test circuit uses the memory circuit.

3. The system-in-package type semiconductor device according to claim 1, wherein when the test circuit is disposed on the logic chip, the memory chip is provided with a sub-test circuit for accessing the memory circuit according to an instruction from the test circuit.

4. The system-in-package type semiconductor device according to claim 1, wherein the test circuit has a function of forcing an internal voltage of the memory circuit based on test data input from a test terminal provided in the external connection terminal, to conduct an accelerated life test.

5. The system-in-package type semiconductor device according to claim 1, wherein the test circuit has a function of conducting a multi-bit test by expanding test data input from a test terminal provided in the external connection terminal, writing the data in the memory circuit, reading data from the memory circuit, and degenerating the read data to decide whether the quality of the data is sufficient.

6. The system-in-package type semiconductor device according to claim 1, wherein the test circuit has a function of conducting a built-in self-test for detecting a defective bit by generating various test patterns, writing the patterns in the memory circuit, reading patterns from the memory circuit, and comparing write data with read data, at the time of power on or at the particular case thereafter as required.

7. The system-in-package type semiconductor device according to claim 6, further comprising a second memory chip for mounting a memory circuit thereon, the memory circuit storing an address of a defective bit detected by the built-in self-test.

8. A system-in-package type semiconductor device comprising:

a memory chip for mounting a memory circuit thereon;

a logic chip for mounting a logic circuit thereon, electrically connected to the memory circuit, the logic circuit and an external connection terminal of a package being connected to each other to be sealed;

a test circuit provided on either the logic chip or the memory chip and for conducting various types of tests by allowing the logic circuit to use an access path to the memory circuit when a mode signal input from a mode terminal provided in the external connection terminal indicates a normal operation mode, or by prohibiting the logic circuit from using the access path but accessing the memory circuit by itself when the mode signal indicates a test mode or when any particular case comes up; and an access control circuit provided in the logic circuit and for controlling access to the memory circuit, wherein when the test circuit is disposed on the logic chip, the test circuit can control the access control circuit so as to select which of the logic circuit and the test circuit uses the memory circuit.

\* \* \* \* \*